(12) United States Patent
Nakamura et al.

(10) Patent No.: US 7,508,073 B2
(45) Date of Patent: Mar. 24, 2009

(54) WIRING BOARD, SEMICONDUCTOR DEVICE USING THE SAME, AND METHOD FOR MANUFACTURING WIRING BOARD

(75) Inventors: Yoshifumi Nakamura, Osaka (JP); Nozomi Shimoishizaka, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 11/733,566

(22) Filed: Apr. 10, 2007

(65) Prior Publication Data
US 2007/0241462 A1 Oct. 18, 2007

(30) Foreign Application Priority Data
Apr. 12, 2006 (JP) .............. 2006-110023

(51) Int. Cl.
*H01L 23/48* (2006.01)
*H01L 23/52* (2006.01)
(52) U.S. Cl. ............... 257/737; 257/778; 257/E23.021
(58) Field of Classification Search ............... 257/780, 257/786, E23.068, 737, 778, E23.021
See application file for complete search history.

(56) References Cited

U.S. PATENT DOCUMENTS

| 6,483,190 | B1 * | 11/2002 | Kainuma et al. | 257/737 |
| 6,710,458 | B2 * | 3/2004 | Seko | 257/778 |
| 6,967,394 | B2 * | 11/2005 | Hayami | 257/666 |
| 7,002,250 | B2 * | 2/2006 | Hozoji et al. | 257/730 |
| 7,436,062 | B2 * | 10/2008 | Kainuma et al. | 257/737 |
| 2004/0212969 | A1 | 10/2004 | Imamura et al. | |
| 2005/0272182 | A1 * | 12/2005 | Smith | 438/106 |

FOREIGN PATENT DOCUMENTS

JP  2004-327936  11/2004

* cited by examiner

*Primary Examiner*—Nitin Parekh
(74) *Attorney, Agent, or Firm*—Hamre, Schumann, Mueller & Larson, P.C.

(57) ABSTRACT

A wiring board includes: an insulating substrate; a plurality of conductive wirings provided on the insulating substrate so as to be aligned with a semiconductor mounting region where a semiconductor chip is to be mounted; and bump electrodes provided on the respective conductive wirings. The bump electrodes include a first bump electrode for mounting the semiconductor chip and a second bump electrode for adjusting a height of the first bump electrode. The second bump electrode is provided at a region of at least one of the plurality of conductive wirings other than the semiconductor mounting region.

9 Claims, 6 Drawing Sheets

WIRING BOARD, SEMICONDUCTOR DEVICE USING THE SAME, AND METHOD FOR MANUFACTURING WIRING BOARD

BACKGROUND OF THE INVENTION

1. Field of the Invention

The present invention relates to a wiring board and a semiconductor device using the same as well as a method for manufacturing a wiring board.

2. Description of Related Art

Chip On Film (COF) is known as a package module using a tape wiring board. In the COF, a semiconductor chip is mounted on a flexible insulating tape wiring board, and the mounted portion is protected by encapsulating the semiconductor chip with a resin. The tape wiring board includes, as major elements, an insulating film substrate and a plurality of conductive wirings formed on a surface thereof. In general, the film substrate is made of polyimide, and the conductive wiring is made of copper. A metal plated coating or a solder resist film optionally is formed on the conductive wirings.

Figure 8:
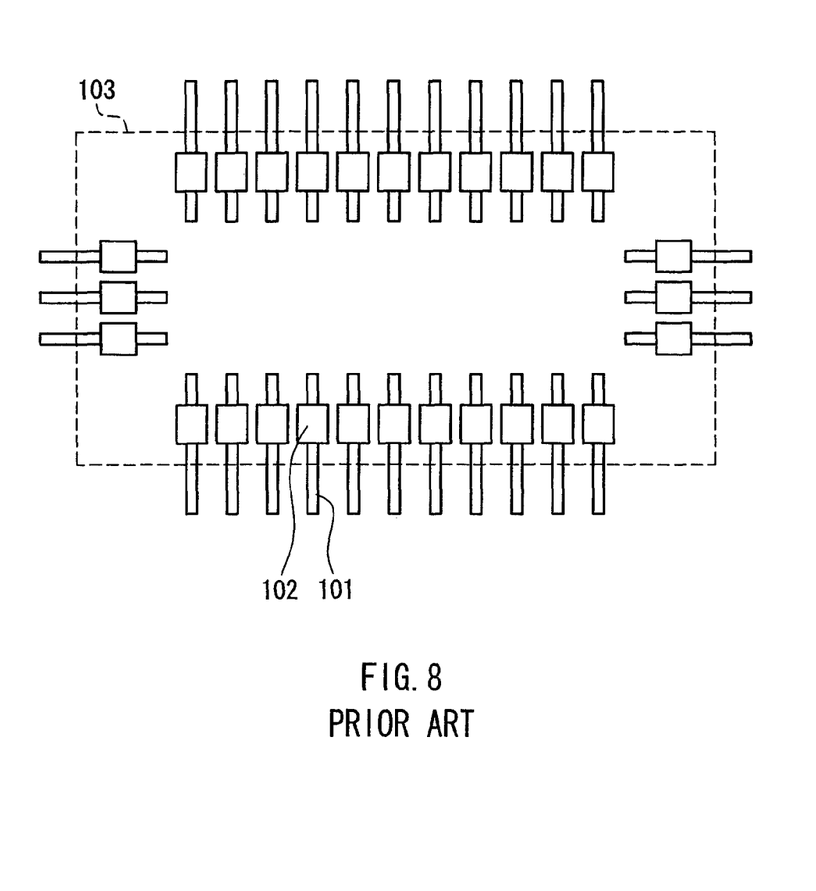
FIG. 8 is a plan view of a major region of the conventional tape wiring board including a semiconductor mounting region.

The COF mainly is used for the mounting of a driver for driving a display panel such as a liquid crystal panel. For instance, JP2004-327936 A describes an exemplary wiring board used in the COF. FIG. 8 shows an exemplary tape wiring board described in JP2004-327936 A, which is a plan view of a major region including a semiconductor mounting region of the tape wiring board. In FIG. 8, reference numeral 101 denotes an inner lead, 102 denotes a bump electrode and 103 denotes a semiconductor mounting region.

When a semiconductor chip is mounted on the thus configured wiring board, heat and pressure or ultrasonic vibration is applied thereto so as to bond electrodes (not illustrated) on the semiconductor chip with the bump electrodes 102. The bump electrodes 102 used for the bonding are manufactured by electrolytic plating or the like, and the thus manufactured bump electrodes generally tend to have varying heights. Conceivably, this results from a variation in a distance between a portion for an electrode to be formed and a current source or a variation in the width of the conductive wirings or the size of the bump electrodes. A variation in height of the bump electrodes 102 will cause a failure of some of the bump electrodes 102 to be bonded with the semiconductor chip, resulting in open defects.

SUMMARY OF THE INVENTION

Therefore, with the foregoing in mind, it is an object of the present invention to provide a wiring board with bump electrodes for bonding provided thereon capable of reducing a variation in height of the bump electrodes, and to provide a semiconductor device using the wiring board as well as a method for manufacturing a wiring board.

In order to attain the above-mentioned object, a wiring board of the present invention includes: an insulating substrate; a plurality of conductive wirings provided on the insulating substrate so as to be aligned with a semiconductor mounting region where a semiconductor chip is to be mounted; and bump electrodes provided on the respective conductive wirings. The bump electrodes include a first bump electrode for mounting the semiconductor chip and a second bump electrode for adjusting a height of the first bump electrode. The second bump electrode is provided at a region of at least one of the plurality of conductive wirings other than the semiconductor mounting region.

A semiconductor device of the present invention includes the above-stated wiring board according to the present invention and a semiconductor chip mounted on the semiconductor mounting region of the wiring board.

A method for manufacturing a wiring board of the present invention includes the following steps of:

(i) forming a plurality of conductive wirings so as to be aligned with a semiconductor mounting region on an insulating substrate where a semiconductor chip is to be mounted;

(ii) forming a photoresist film at a region on the insulating substrate where the plurality of conductive wirings are provided;

(iii) forming apertures in the photoresist film so as to expose a part of the conductive wirings through the apertures;

(iv) conducting metal plating with respect to the exposed part of the conductive wirings to form bump electrodes; and (v) removing the photoresist film.

In this method, the bump electrodes include a first bump electrode for mounting the semiconductor chip and a second bump electrode for adjusting a height of the first bump electrode. The second bump electrode is provided at a region of at least one of the plurality of conductive wirings other than the semiconductor mounting region.

These and other advantages of the present invention will become apparent to those skilled in the art upon reading and understanding the following detailed description with reference to the accompanying figures.

DETAILED DESCRIPTION OF THE INVENTION

A wiring board of the present invention includes an insulating substrate, a plurality of conductive wirings provided on the insulating substrate so as to be aligned with a semiconductor mounting region where a semiconductor chip is to be mounted and bump electrodes provided on the respective conductive wirings.

Although the insulating substrate is not limited particularly, a tape substrate made of a flexible material such as a polyimide film allows the wiring board of the present invention to be used as a foldable wiring board. The thickness of the insulating substrate may be about 5 to 100 μm, for example.

The conductive wirings may be made of metal such as copper or copper alloy. The pitch of the conductive wirings may be about 10 to 100 μm, for example. The height and the width of the conductive wirings may be about 4 to 35 μm and 5 to 50 μm, respectively, for example.

The bump electrodes provided on the respective conductive wirings include first bump electrodes for mounting a semiconductor chip and a second bump electrode for adjusting heights of the first bump electrodes. The second bump electrode may be provided at a region of at least one conductive wiring other than a semiconductor mounting region.

The first and second bump electrodes may be made of metal such as copper or gold, for example, and be manufactured by plating or the like. Typically, the height of the first bump electrodes may be about 1 to 20 μm. The second bump electrodes may be provided at conductive wirings on which the first bump electrodes tend to be relatively high during the process for forming the bump electrodes. For instance, in the case where the bump electrodes are formed by electrolytic plating, the second bump electrodes may be provided at the conductive wirings having a current crowding tendency. Thereby, the current can be distributed over the first bump electrode and the second bump electrode, and therefore the growth rate of the first bump electrode on the conductive wiring having the second bump electrode provided thereon will decrease, thus adjusting the height of such a first bump electrode to the height of the first bump electrodes on other conductive wirings. Although the height of the second bump electrode is not limited particularly as long as it can reduce the variation in height of the first bump electrodes, the height of the second bump electrode may be about 1 to 20 μm, for example.

A semiconductor device of the present invention includes the above-described wiring board of the present invention and a semiconductor chip mounted at a semiconductor mounting region of the wiring board. According to the semiconductor device of the present invention, since the above-described wiring board of the present invention is employed, the height of the first bump electrodes for bonding with the semiconductor chip can be made uniform. Thereby, the reliability of the electric connection between the semiconductor chip and the first bump electrodes can be enhanced.

A method for manufacturing a wiring board of the present invention includes the steps of: (i) forming a plurality of conductive wirings so as to be aligned with a semiconductor mounting region on an insulating substrate where a semiconductor chip is to be mounted; (ii) forming a photoresist film at a region on the insulating substrate where the plurality of conductive wirings are provided; (iii) forming apertures in the photoresist film so as to expose a part of the conductive wirings through the apertures; (iv) conducting metal plating with respect to the exposed part of the conductive wirings to form bump electrodes; and (v) removing the photoresist film. In this method, the bump electrodes include a first bump electrode for mounting the semiconductor chip and a second bump electrode for adjusting a height of the first bump electrode. The second bump electrode is provided at a region of at least one of the plurality of conductive wirings other than the semiconductor mounting region. Thereby, the height of the first bump electrodes for bonding with the semiconductor chip can be made uniform. Therefore, the semiconductor chip and the first bump electrodes can be bonded with reliability.

The following describes embodiments of the present invention, with reference to the drawings. In the following, same reference numerals may be assigned to the elements having substantially similar functions in the drawings and their explanations will be not be repeated.

Embodiment 1

Figure 1A:
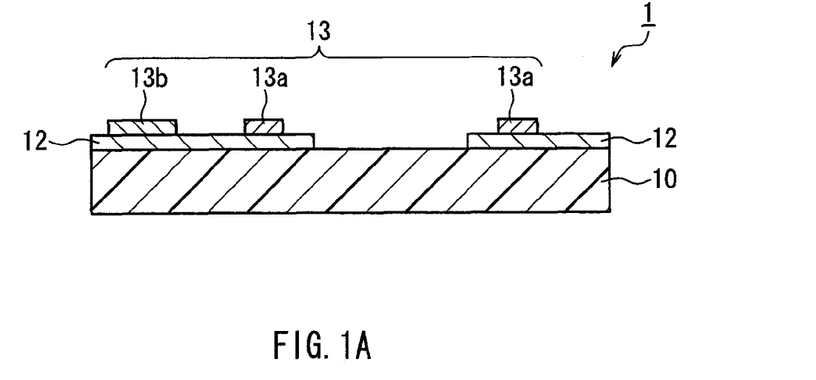
FIG. 1A is a cross-sectional view of a wiring board according to Embodiment 1 of the present invention.
Figure 1B:
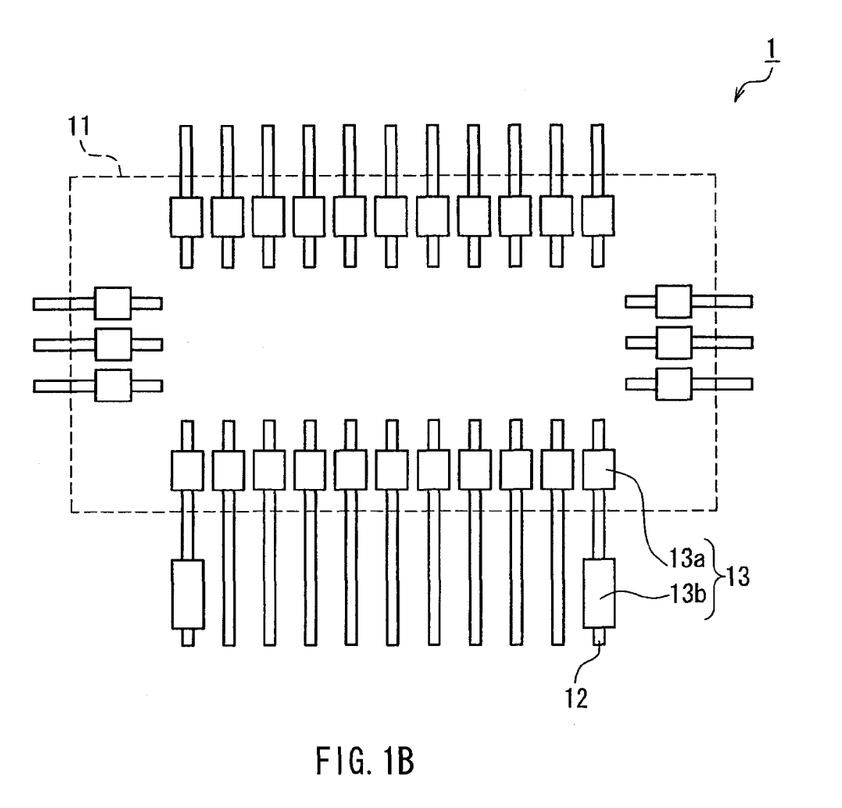
FIG. 1B is a plan view of a major region of the wiring board of FIG. 1A including a semiconductor mounting region.

A wiring board according to Embodiment 1 of the present invention will be described below with reference to FIGS. 1A and B. FIG. 1A is a cross-sectional view of a wiring board according to Embodiment 1 of the present invention. FIG. 1B is a plan view of a major region of the wiring board of FIG. 1A including a semiconductor mounting region.

As shown in FIGS. 1A and B, a wiring board 1 includes an insulating substrate 10, a plurality of conductive wirings 12 provided on the insulating substrate 10 so as to be aligned with a semiconductor mounting region 11 and bump electrodes 13 provided on the respective conductive wirings 12.

The bump electrodes 13 include first bump electrodes 13a for mounting a semiconductor chip (not illustrated) and second bump electrodes 13b for adjusting the height of the first bump electrodes 13a. As shown in FIG. 1B, the second bump electrodes 13b are provided at regions of a part of the conductive wirings 12 other than the semiconductor mounting region 11. With this configuration, when the bump electrodes 13 are formed by electrolytic plating, for example, the current can be distributed over the first bump electrode 13a and the second bump electrode 13b. Therefore in the case of the conductive wiring 12 having a current crowding tendency, the second bump electrode 13b functions to decrease the growth rate of the first bump electrode 13a provided thereon as compared with the growth rate in the conventional configuration without such a second bump electrode 13b. Thus, the height of such a first bump electrode 13a can be adjusted to the height of the first bump electrodes 13a on other conductive wirings 12. Further, since the second bump electrode 13b is provided at a region other than the semiconductor mounting region 11, the second bump electrode 13b does not interfere with the mounting of a semiconductor chip.

Referring now to FIGS. 2A to E, a method for manufacturing the above-stated wiring board 1 will be described below. FIGS. 2A to E are cross-sectional views each showing a step of a preferable manufacturing method of the wiring board 1.

Figure 2A:
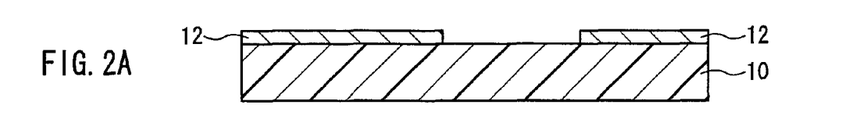
FIGS. 2A to E are cross-sectional views each showing a step of a preferable manufacturing method of the wiring board according to Embodiment 1 of the present invention.

Firstly, as shown in FIG. 2A, conductive wirings 12 made of a conductive material are formed on the insulating substrate 10. The conductive wirings 12 may be formed by etching, a semiadditive process or the like. The conductive wirings 12 preferably are made of a material containing as main components copper, silver, aluminum, tin, palladium, nickel, gold or the like.

Figure 2B:
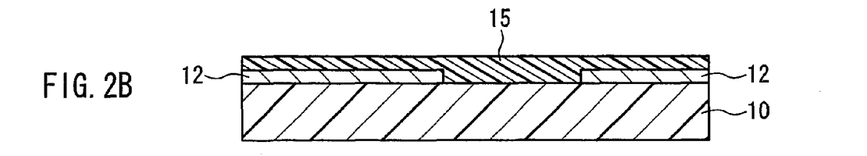

Next, as shown in FIG. 2B, a photoresist film 15 is formed at a region on the insulating substrate 10 where the conductive wirings 12 are provided. The photoresist film 15 typically is formed by thermocompression bonding of a photoresist film 15 in a sheet form or by applying a photoresist in a liquid form. A material of the photoresist film 15 is not limited especially, and it may be a negative type or a positive type. The photoresist film 15 preferably is thicker than the first bump electrodes 13a (.e., the height of the first bump electrodes 13a). For instance, the photoresist film 15 preferably is thicker than the first bump electrodes 13a by about 2 to 10 μm.

Figure 2C:
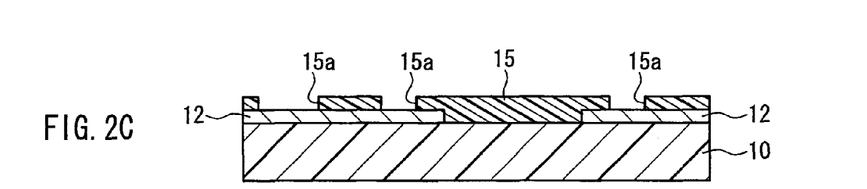

Next, as shown in FIG. 2C, an aperture 15a is formed by photolithography at a region where a bump electrode 13 is to be formed. The aperture 15a is formed so as to expose the conductive wiring 12 partially. Herein, a pattern of the aperture 15a corresponding to a region where the first bump electrode 13a is to be formed may be formed continuously so as to extend over the adjacent conductive wiring 12. The aperture 15a corresponding to a region where the second bump electrode 13b is to be formed is formed outside the semiconductor mounting region 11 (see FIG. 1B). Considering the accuracy of the alignment with a photomask that is used for forming the apertures 15a by photolithography, a gap between the aperture 15a corresponding to a region where the second bump electrode 13b is to be formed and the adjacent conductive wiring 12 preferably is made wider.

Figure 2D:
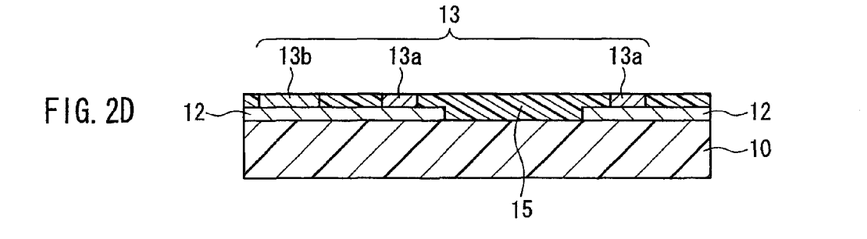

Next, as shown in FIG. 2D, bump electrodes 13 (first and second bump electrodes 13a and 13b) are formed within the apertures 15a (see FIG. 2C) by electrolytic plating. The electrolytic plating requires a wiring for feeding electricity, and the position of such a wiring might affect the height of the first bump electrodes 13a. Therefore, the size of the second bump electrode 13b (i.e., the size of the aperture 15a corresponding to the region where the second bump electrode 13b is to be formed) has to be adjusted with consideration given to such an effect. Incidentally, the standard deviation ($\sigma$) of the height of the bump electrodes in the conventional wiring board is about 1.4 µm, whereas according to the present invention the standard deviation ($\sigma$) can be improved to about 0.8 µm, for example.

Figure 2E:
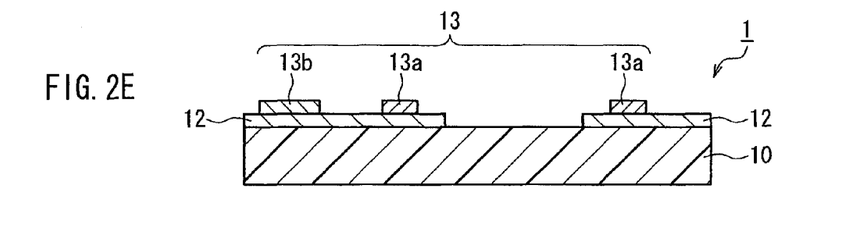

Next, the photoresist film 15 is removed by an alkaline or an organic chemical solution, so as to obtain a wiring board 1 shown in FIG. 2E. Although not illustrated, a solder resist film may be formed subsequently in order to protect a predetermined region. Further, in order to protect the outermost face of the conductive wirings 12, a gold plated film may be formed over the conductive wirings 12.

Embodiment 2

Figure 3:
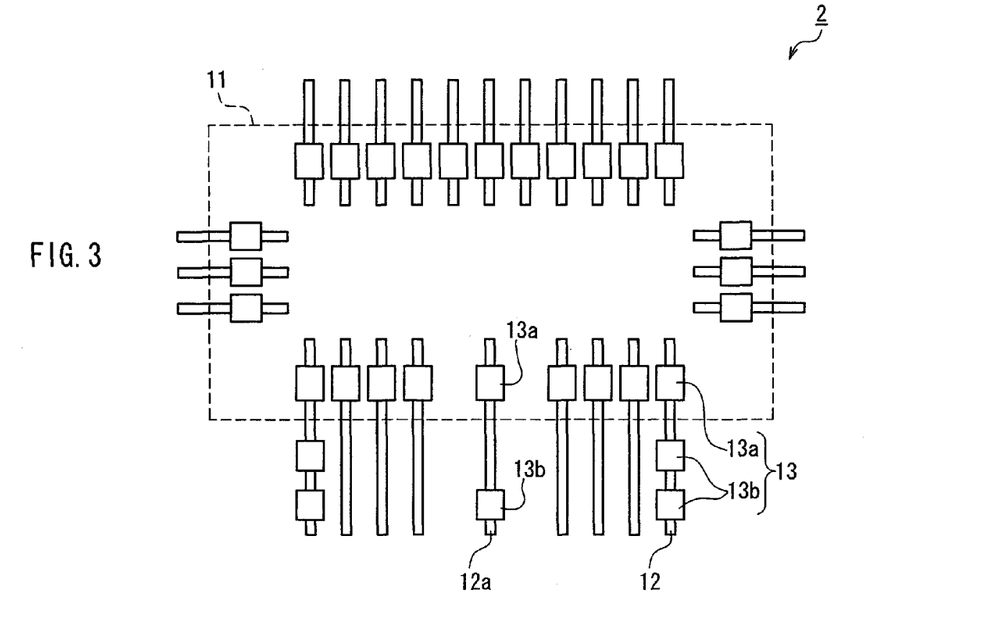
FIG. 3 is a plan view of a major region of a wiring board according to Embodiment 2 of the present invention including a semiconductor mounting region.

A wiring board according to Embodiment 2 of the present invention will be described below with reference to FIG. 3. FIG. 3 is a plan view of a major region of the wiring board according to Embodiment 2 including a semiconductor mounting region.

As shown in FIG. 3, on the wiring board 2, there is a sparse pitch region where conductive wirings 12 are sparsely arranged and a dense pitch region where conductive wirings 12 are densely arranged. Conductive wirings 12a arranged in the sparse pitch region are provided with second bump electrodes 13b. When bump electrodes 13 are formed by electrolytic plating, a fresh plating solution tends to concentrate more at the sparse pitch region than the other region because of a difference in fluidity of the plating solution. Therefore, the first bump electrodes 13a in the sparse pitch region tend to be higher. In such a case, by providing the conductive wirings 12a arranged in the sparse pitch region with the second bump electrodes 13b as stated above, the plating solution can be well distributed over the first bump electrodes 13a and the second bump electrodes 13b. Thereby, the height of the first bump electrodes 13a in the sparse pitch region can be adjusted to the height of the first bump electrodes 13a in the other region.

Further, some of the conductive wirings 12 on the wiring board 2 are provided with two second bump electrodes 13b. In this way, according to the present invention, if there is a limitation on the size of the region for disposing the second bump electrode 13b because of a design of the conductive wirings 12, the second bump electrode 13b may be divided and arranged. The wiring board 2 can be manufactured similarly by the above-stated manufacturing method of FIGS. 2A to E except that the arrangement pattern of the conductive wirings 12 of FIG. 2A and the arrangement pattern of the apertures 15a of FIG. 2C are changed, and therefore their explanations will not be repeated.

Embodiment 3

Figure 4:
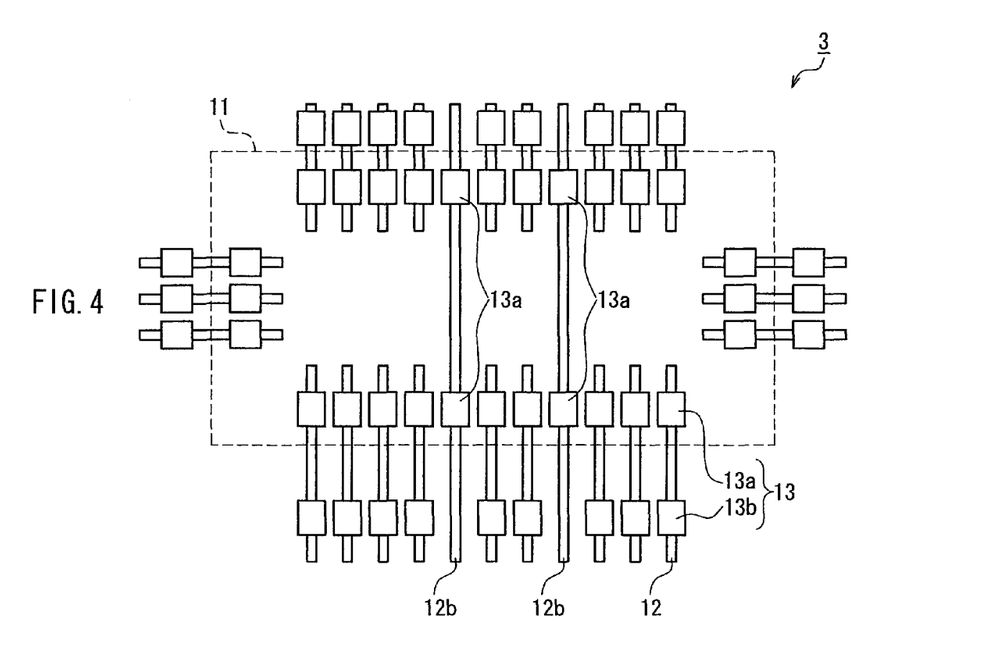
FIG. 4 is a plan view of a major region of a wiring board according to Embodiment 3 of the present invention including a semiconductor mounting region.

A wiring board according to Embodiment 3 of the present invention will be described below with reference to FIG. 4. FIG. 4 is a plan view of a major region of the wiring board according to Embodiment 3 including a semiconductor mounting region.

As shown in FIG. 4, some of the conductive wirings 12 (conductive wirings 12b) on a wiring board 3 are provided with two first bump electrodes 13a. In this way, when some of the conductive wirings 12 have two or more first bump electrodes 13a for connecting with a semiconductor, such first bump electrodes 13a on the conductive wirings 12 tend to be lower than the first bump electrodes 13 on the other conductive wirings 12. In order to correct a difference in height of such first bump electrodes 13a, each conductive wiring 12 on the wiring board 3 has bump electrodes 13 (first and second bump electrodes 13a and 13b) in the same number. With this configuration, it is possible to make the height of the first bump electrodes 13a uniform. The wiring board 3 can be manufactured similarly by the above-stated manufacturing method of FIGS. 2A to E except that the arrangement pattern of the conductive wirings 12 of FIG. 2A and the arrangement pattern of the apertures 15a of FIG. 2C are changed, and therefore their explanations will not be repeated.

Embodiment 4

Figure 5:
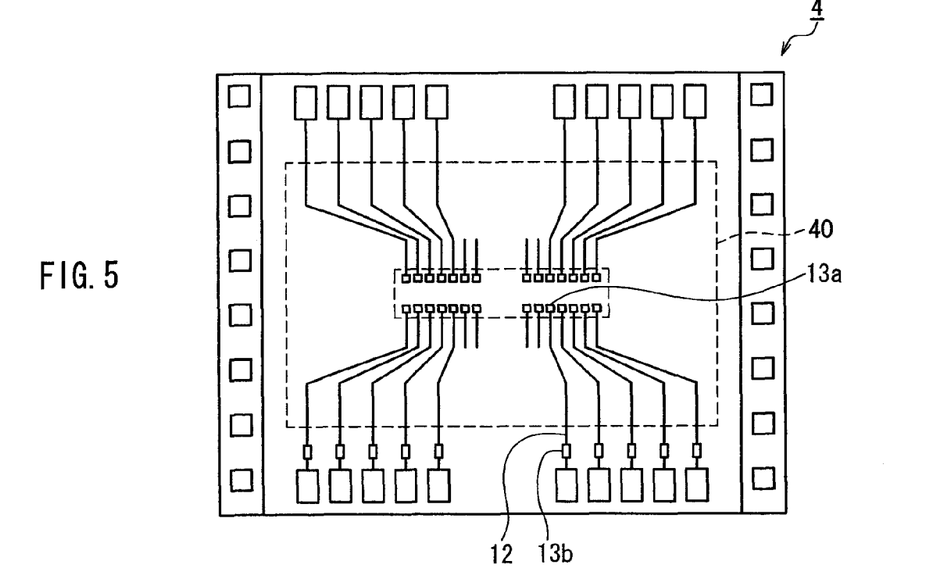
FIG. 5 is a plan view of a major region of a wiring board according to Embodiment 4 of the present invention including a semiconductor mounting region.

A wiring board according to Embodiment 4 of the present invention will be described below with reference to FIG. 5. FIG. 5 is a plan view of a major region of the wiring board according to Embodiment 4 including a semiconductor mounting region.

As shown in FIG. 5, on a wiring board 4, second bump electrodes 13b are provided outside a region 40 where a package (not illustrated) including a semiconductor chip is to be arranged. With this configuration, the second bump electrodes 13b do not interfere with the disposition of the package. The wiring board 4 can be manufactured similarly by the above-stated manufacturing method of FIGS. 2A to E, and therefore their explanations will not be repeated.

Embodiment 5

Figure 6:
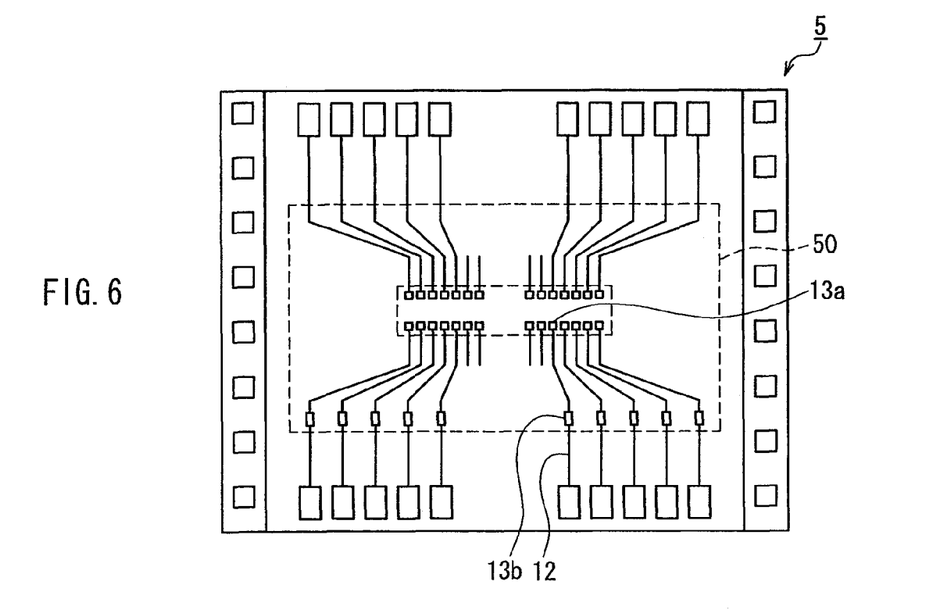
FIG. 6 is a plan view of a major region of a wiring board according to Embodiment 5 of the present invention including a semiconductor mounting region.

A wiring board according to Embodiment 5 of the present invention will be described below with reference to FIG. 6. FIG. 6 is a plan view of a major region of the wiring board according to Embodiment 5 including a semiconductor mounting region.

As shown in FIG. 6, on a wiring board 5, second bump electrodes 13b are provided at a region 50 that is covered with a solder resist film (not illustrated). With this configuration, in a semiconductor device formed with the wiring board 5, the second bump electrodes 13b are not exposed, and therefore the second bump electrodes 13b do not interfere with the mounting of the semiconductor device to a glass substrate or the like. The wiring board 5 can be manufactured similarly by the above-stated manufacturing method of FIGS. 2A to E, and therefore their explanations will not be repeated.

Embodiment 6

Figure 7:
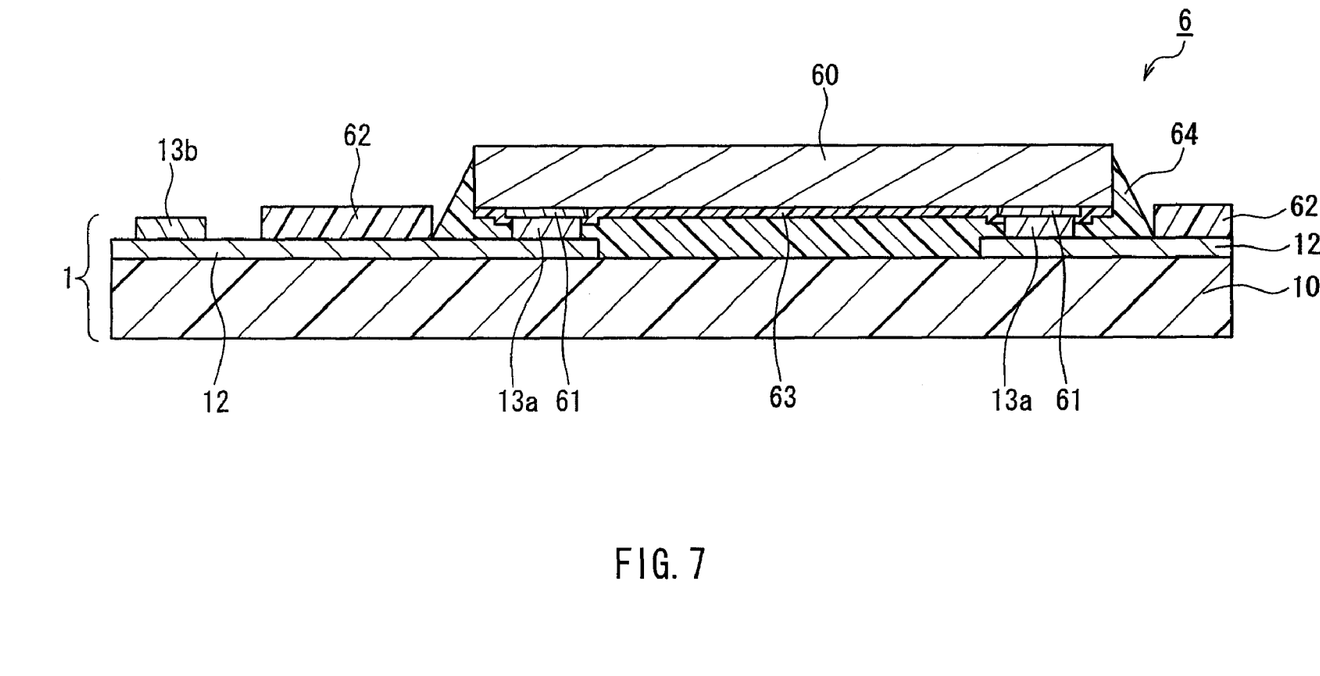
FIG. 7 is a cross-sectional view of a semiconductor device according to Embodiment 6 of the present invention.

A semiconductor device according to Embodiment 6 of the present invention will be described below, with reference to FIG. 7. FIG. 7 is a cross-sectional view of a semiconductor device according to Embodiment 6. Note here that the semiconductor device according to Embodiment 6 employs the above-stated wiring board 1 (see FIGS. 1A and B).

As shown in FIG. 7, the semiconductor device 6 includes a wiring board 1 and a semiconductor chip 60 mounted on first bump electrodes 13a of the wiring board 1. Since the semiconductor device 6 employs the wiring board 1 according to one embodiment of the present invention, the height of the first bump electrodes 13a for bonding with the semiconductor chip 60 can be made uniform. With this configuration, the reliability of the electric connection between the semiconductor chip 60 and the first bump electrodes 13a can be enhanced. In FIG. 7, reference numeral 61 denotes an electrode pad of the semiconductor chip 60, 62 denotes a solder resist film, 63 denotes a surface protective film that protects a surface of the semiconductor chip 60 and 64 denotes an encapsulation resin for protection.

As stated above, according to the wiring board and the manufacturing method for the same of the present invention, second bump electrodes are provided for adjusting a variation in height of bump electrodes for bonding (first bump electrodes). Therefore, a semiconductor chip and the first bump electrodes can be bonded reliably. Since the semiconductor device of the present invention employs the above-stated wiring board of the present invention, the reliability of the electric connection between a semiconductor chip and the first bump electrodes can be enhanced.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A wiring board, comprising: an insulating substrate; a plurality of conductive wirings provided on the insulating substrate so as to be aligned with a semiconductor mounting region where a semiconductor chip is to be mounted; bump electrodes provided on the respective conductive wirings; and external connection terminals connected to the conductive wiring so as to be connected with an external device, wherein the bump electrodes comprise first bump electrodes for mounting the semiconductor chip and second bump electrodes for adjusting height of the first bump electrodes, the first bump electrodes and the second bump electrodes are formed by plating, at least one of the second bump electrodes is provided at a region of the plurality of conductive wirings outside the semiconductor mounting region so as to be located between the semiconductor mounting region and the external connection terminals, and the second bump, electrodes protrude from the surface of the conductive wirings in a height direction of the semiconductor chip.

2. The wiring board according to claim 1, wherein some of the conductive wirings at the semiconductor mounting region on the insulating substrate are arranged with a sparse pitch relative to other conductive wirings and the other conductive wirings are arranged with a dense pitch relative to the some of the conductive wirings, and the second bump electrodes are provided on the some of the conductive wirings that are arranged with the sparse pitch relative to the other conductive wirings.

3. The wiring board according to claim 1, wherein each of the plurality of conductive wirings is provided with the sonic total number of the first and second bump electrodes.

4. The wiring board according to claim 1, wherein the second bump electrode is provided at a region other than a region where a package including the semiconductor chip is disposed.

5. The wiring board according to claim 1, wherein at least one of the plurality of conductive wirings is provided with a plurality of the second bump electrodes.

6. The wiring board according to claim 1, wherein the second bump electrode is provided at region that is covered with a solder resist film.

7. The wiring board according to claim 1, wherein the insulating substrate comprises a tape substrate made of a flexible material.

8. A semiconductor device comprising: the wiring board according to claim 1; and a semiconductor chip mounted on the semiconductor mounting region of the wiring board.

9. The wiring board according to claim 1, wherein all of the second bump electrodes are provided on the conductive wirings at a region outside the semiconductor mounting region so as to be located between the semiconductor mounting region and the external connection terminals.

* * * * *